United States Patent
Xie et al.

(10) Patent No.: US 9,362,181 B1
(45) Date of Patent: Jun. 7, 2016

(54) METHODS OF FORMING DIFFUSION BREAKS ON INTEGRATED CIRCUIT PRODUCTS COMPRISED OF FINFET DEVICES AND THE RESULTING PRODUCTS

(71) Applicant: GLOBALFOUNDRIES Inc., Grand Cayman (KY)

(72) Inventors: Ruilong Xie, Niskayuna, NY (US); Min Gyu Sung, Latham, NY (US); Ryan Ryoung-Han Kim, Albany, NY (US); Kwan-Yong Lim, Niskayuna, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/674,924

(22) Filed: Mar. 31, 2015

Related U.S. Application Data

(60) Provisional application No. 62/088,178, filed on Dec. 5, 2014.

(51) Int. Cl.
*H01L 29/66* (2006.01)
*H01L 21/8238* (2006.01)
*H01L 27/092* (2006.01)
*H01L 29/06* (2006.01)

(52) U.S. Cl.
CPC *H01L 21/823878* (2013.01); *H01L 21/823821* (2013.01); *H01L 21/823857* (2013.01); *H01L 27/0924* (2013.01); *H01L 29/0653* (2013.01); *H01L 29/66545* (2013.01)

(58) Field of Classification Search
CPC .......... H01L 29/66795; H01L 29/785; H01L 29/4238; H01L 29/0696
USPC .......................................... 257/401
See application file for complete search history.

(56) References Cited

U.S. PATENT DOCUMENTS 8,878,309 B1 * 11/2014 Hong ................ H01L 27/0886
257/330

* cited by examiner

*Primary Examiner* — Monica D Harrison
(74) *Attorney, Agent, or Firm* — Amerson Law Firm, PLLC

(57) ABSTRACT

One illustrative method disclosed herein includes forming first sacrificial gate structures above a fin for two active gates and a dummy gate, removing the first sacrificial gate structure for the dummy gate so as to define a cavity that exposes the fin while leaving the first sacrificial gate structures for the two active gates intact, etching through the cavity to form a trench in the fin under the cavity, forming a second sacrificial gate structure for the dummy gate, removing the first sacrificial gate structures for the two active gates and the second sacrificial gate structure for the dummy gate so as to define a replacement gate cavity for the two active gates and the dummy gate, and forming a replacement gate structure in each of the replacement gate cavities, wherein the replacement gate structure for the dummy gate extends into the trench in the fin.

31 Claims, 19 Drawing Sheets

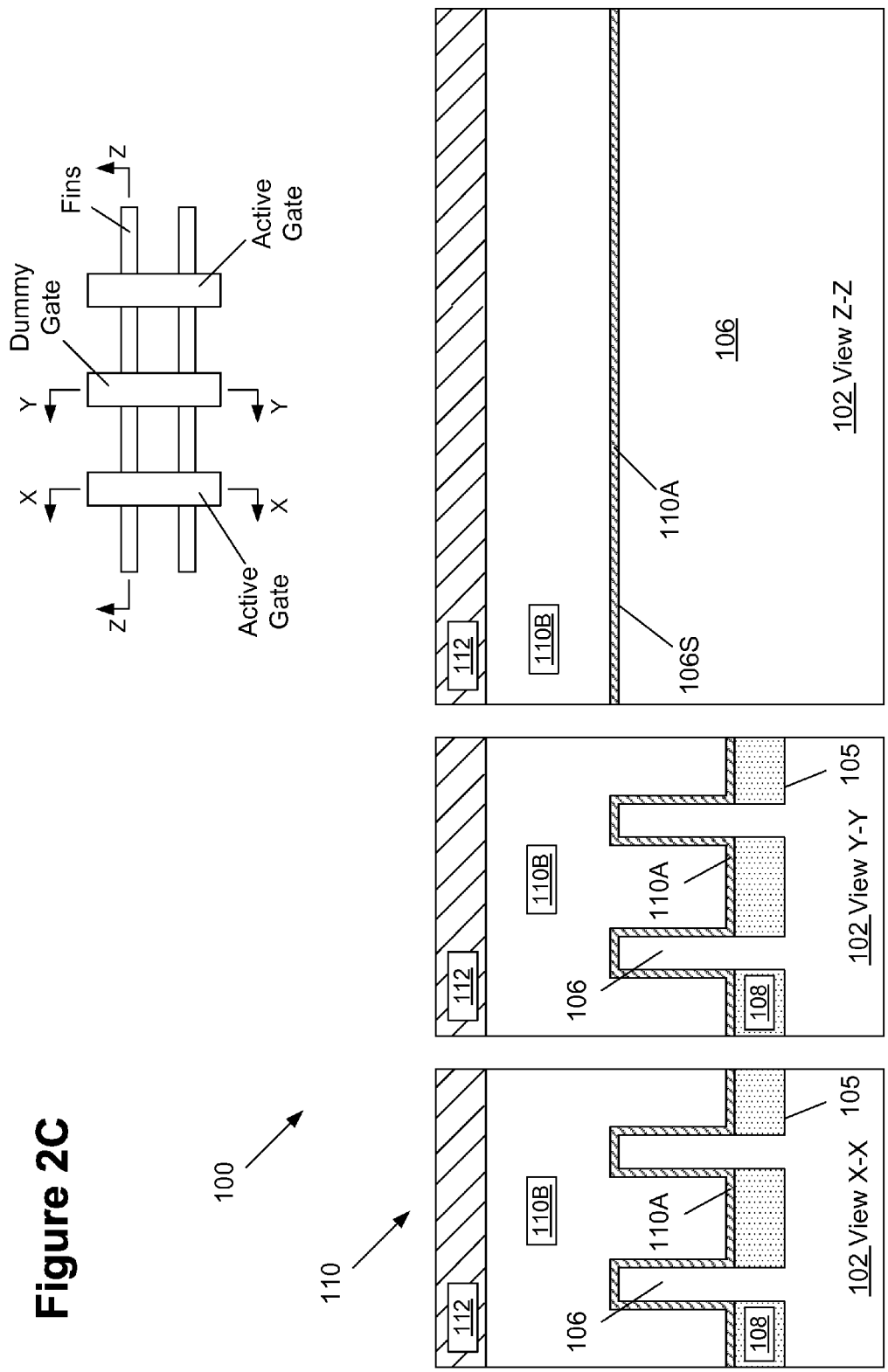

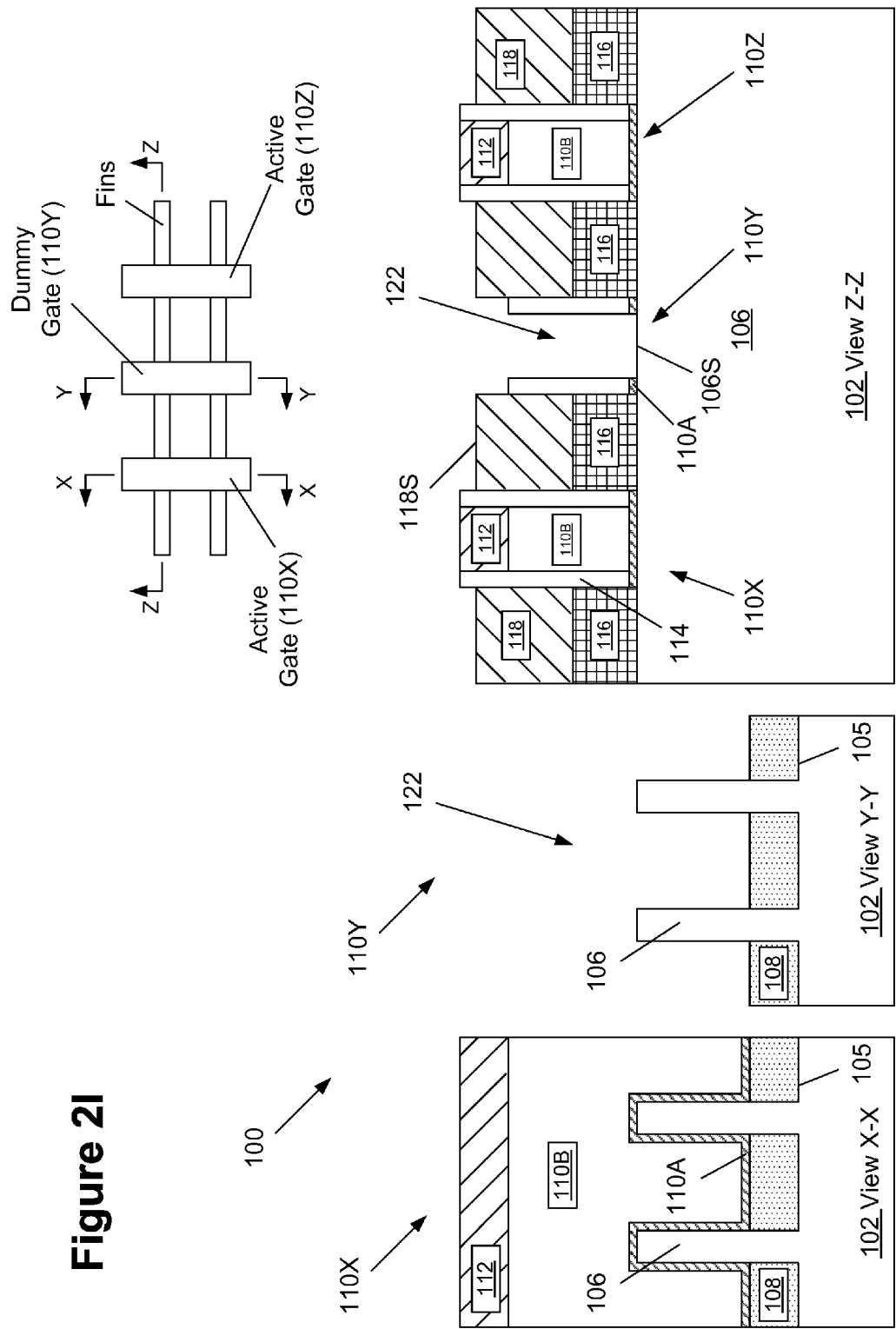

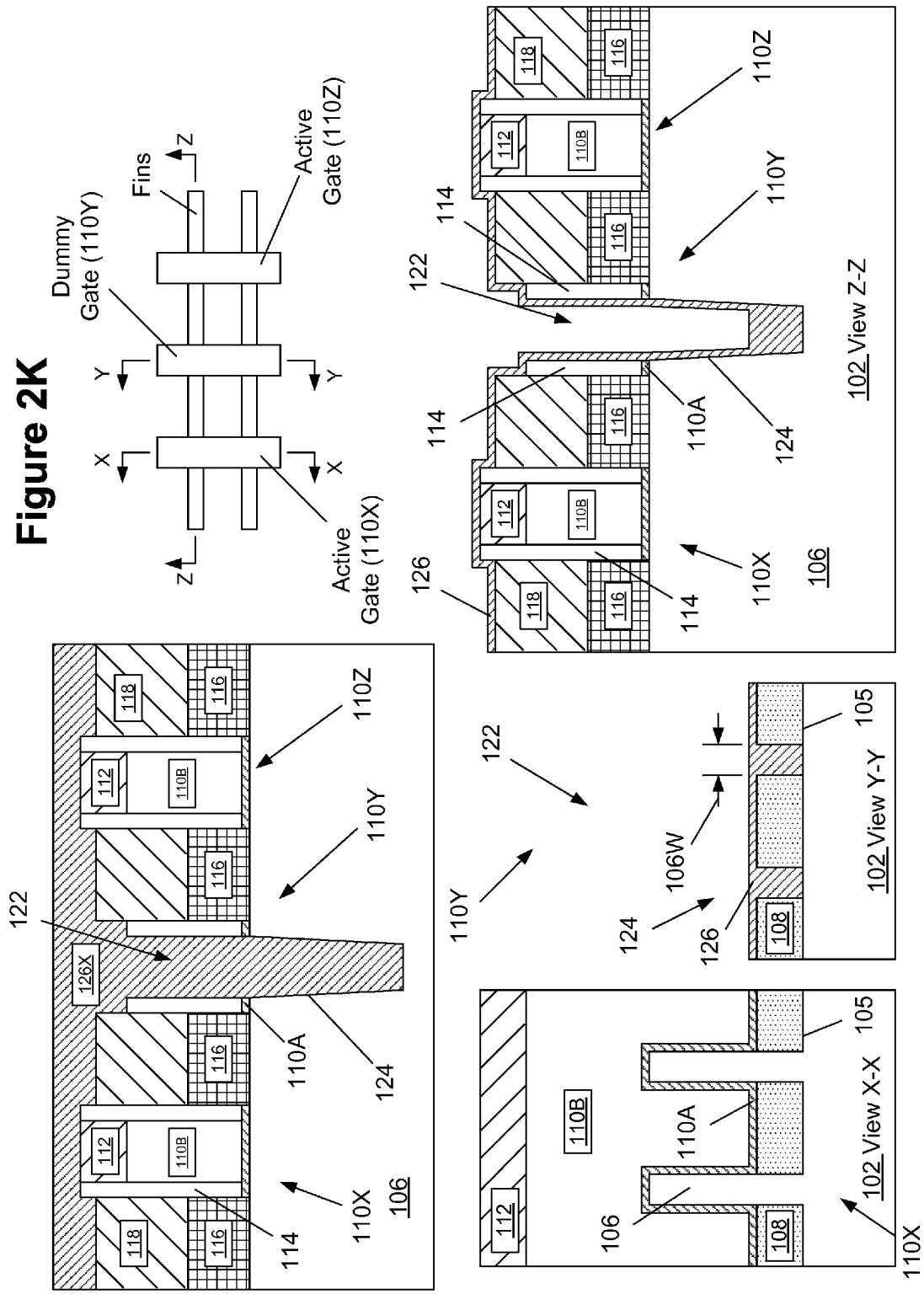

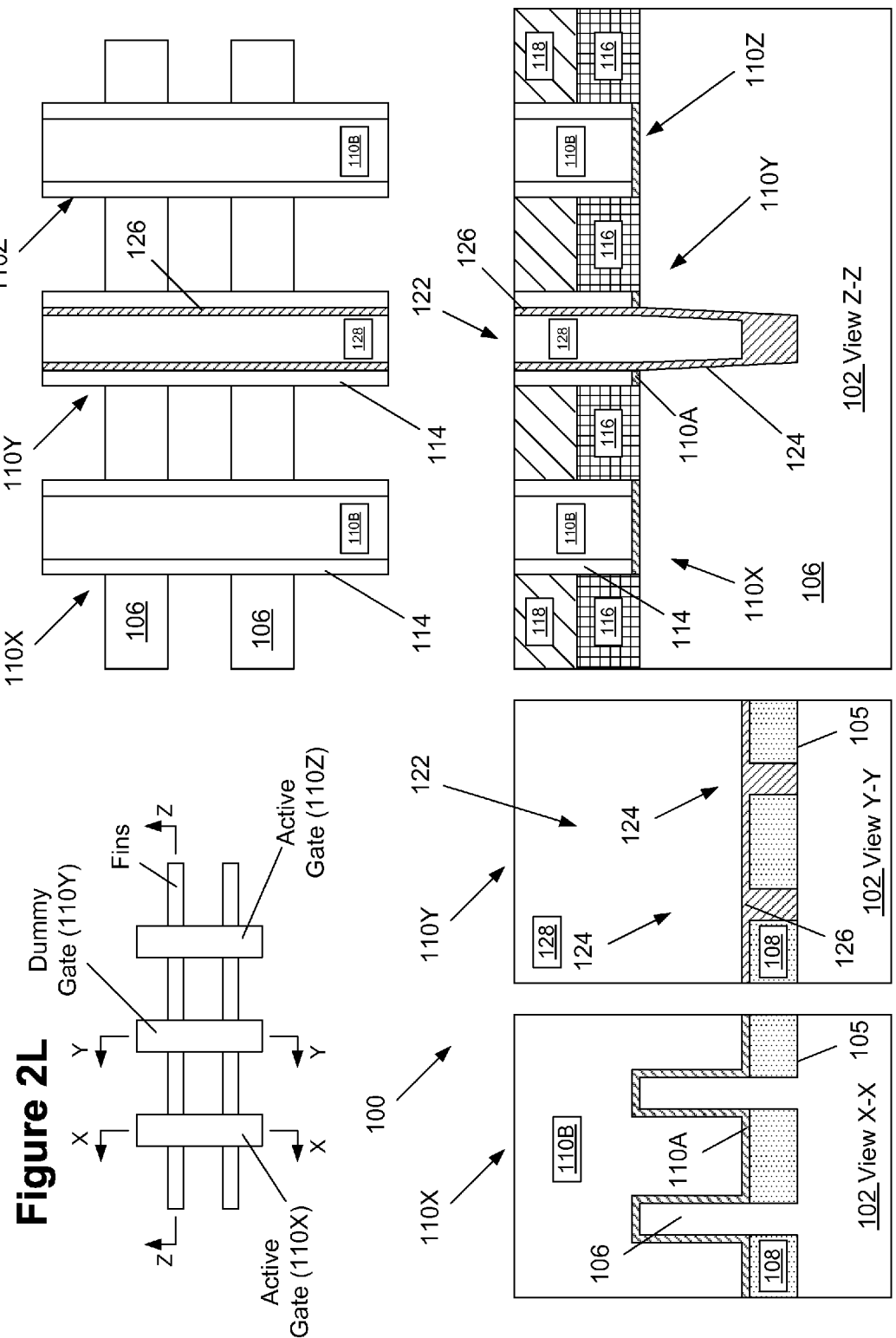

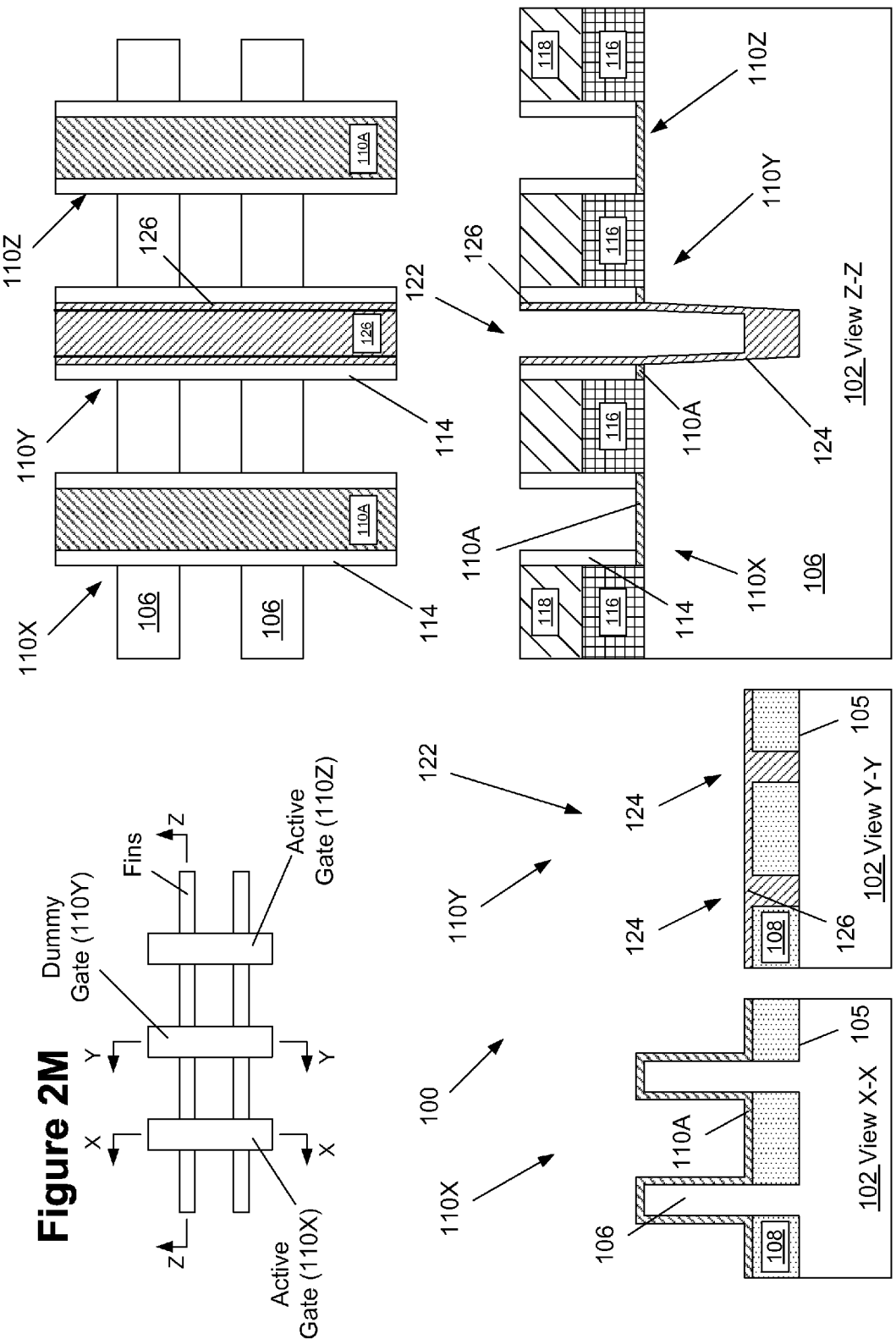

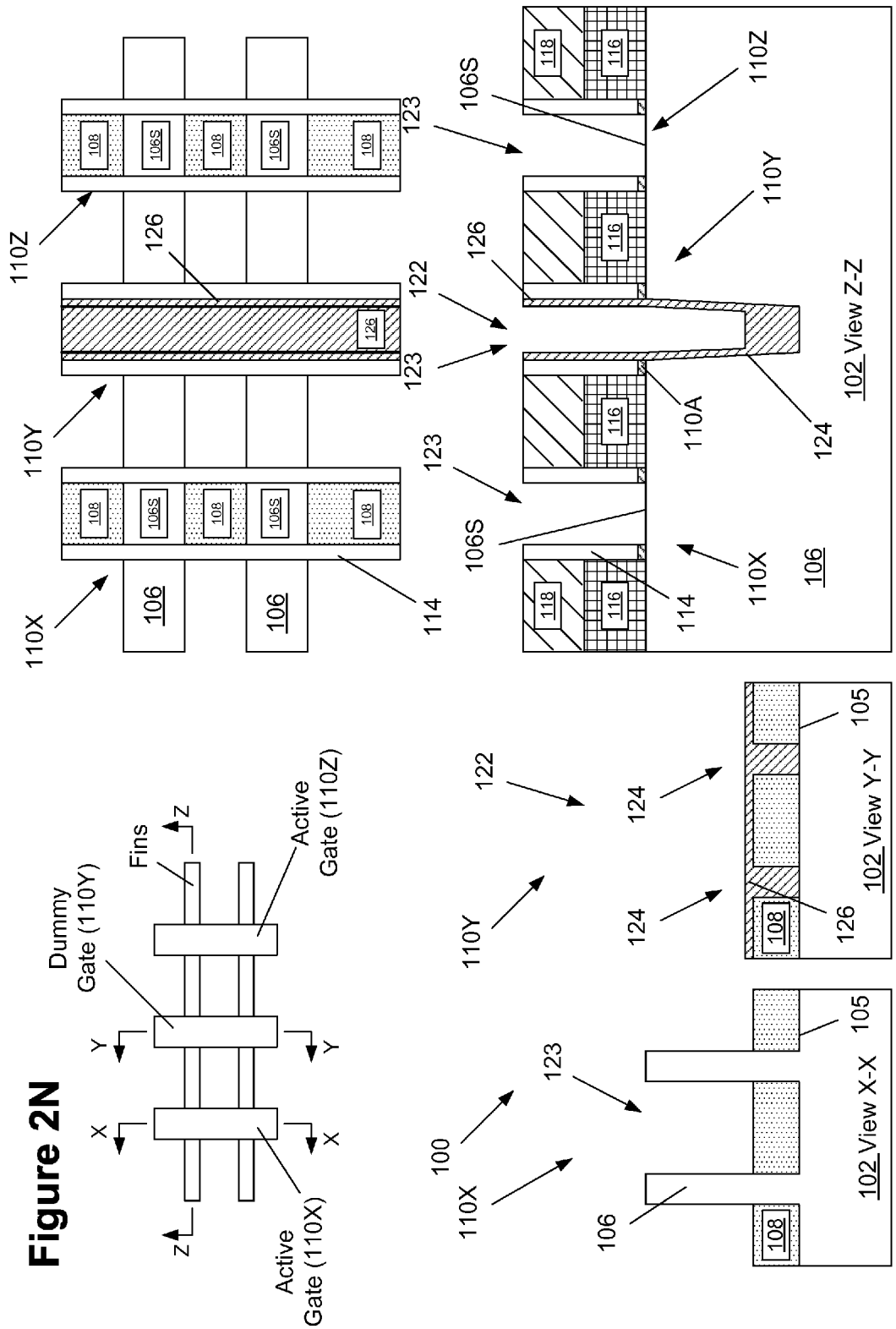

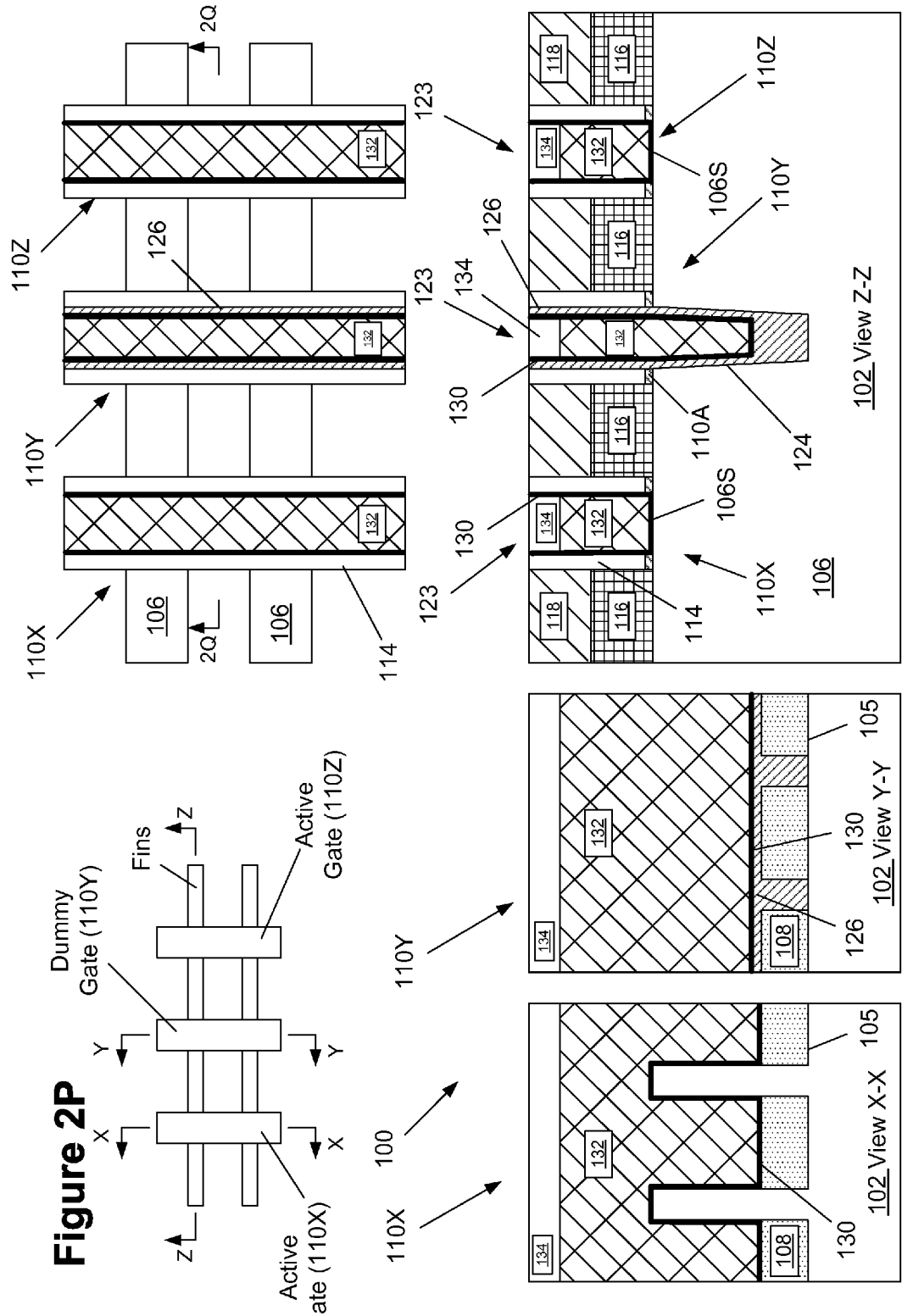

METHODS OF FORMING DIFFUSION BREAKS ON INTEGRATED CIRCUIT PRODUCTS COMPRISED OF FINFET DEVICES AND THE RESULTING PRODUCTS

BACKGROUND OF THE INVENTION

1. Field of the Invention

Generally, the present disclosure relates to the manufacture of semiconductor devices, and, more specifically, to various novel methods of forming diffusion breaks on integrated circuit (IC) products comprised of FinFET devices and the resulting IC products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate cap 20. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The axial length 14L of the fins 14 corresponds to the direction of current travel, i.e., the gate length (GL) of the device 10 when it is operational. The gate width (GW) of the overall device is also depicted in FIG. 1A. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to grow additional semiconductor material on the fins in the source/drain regions of the device 10.

FIG. 1B is a cross-sectional view of the device 10 taken through the gate structure 16 in the gate width (GW) direction of the device with additional layers of material and structures not depicted in FIG. 1A. As shown therein, the device 10 includes a recessed layer of insulating material 22 positioned between the fins 14, another layer of insulating material 24 that is positioned above the gate cap layer 20 and a gate contact structure 28 that is conductively coupled to the gate structure 16. The device 10 depicted in FIG. 1B is a tri-gate (or triple gate) FinFET device. That is, during operation, a very shallow conductive region 26 (shown only on the middle fin in FIG. 1B) will be established that provides a path or channel for current to flow from the source region to the drain region. The conductive region 26 forms inward of the side surfaces 14S and below the top surface 14T of the fins 14.

For many early device technology generations, the gate electrode structures of most transistor elements was comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate structures comprised of a high-k gate insulation layer (k value of 10 or greater) and one or more metal layers, a so-called high-k dielectric/metal gate (HK/MG) configuration, have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, formation of epi semiconductor material in the source/drain regions of the device, performing an anneal process to repair damage to the substrate caused by the ion implantation processes and to activate the implanted dopant materials, etc. At some point in the process flow, the sacrificial gate structure is removed to define a gate cavity where the final HK/MG replacement gate structure for the device is formed.

The various transistor devices that are formed for an IC product must be electrically isolated from one another to properly function in an electrical circuit. Typically, this is accomplished by forming a trench in the substrate 12, and filling the trench with an insulating material, such as silicon dioxide. However, the formation of such trenches consumes very valuable plot space on the substrate 12. Moreover, in some applications, such as those integrated circuit products employing FinFET transistor devices, as device sizes have decreased, and packing densities have increased, it is sometimes difficult to form the desired isolation region made of an insulating material.

FIG. 1C is a simplistic plan view of an integrated circuit product that has two logic cells positioned side by side on a substrate, wherein the circuits are manufactured using Fin-FET devices. FIG. 1C depicts the fins, the active gates and the dummy gates of the logic cells. Typically, the fins are formed uniformly across the entire substrate (i.e., a "sea of fins"). Thereafter, portions of the fins are removed to define regions where isolation regions will be formed to electrically isolate the various devices. Cutting the desired portions of the fins is typically accomplished by forming a so-called "fin cut" patterned etch mask with openings corresponding to the portions of the fins to be removed. The space previously occupied by the removed portions of the fins is then filled with an insulating material. After the fins are cut, and the isolation regions are formed, the gate structures are then formed across the fins. In the case where a replacement gate process is used, the initial gate structures are sacrificial gate structures that will subsequently be removed and replaced with final gate structures for the devices. As mentioned above, several process operations are performed after the formation of the sacrificial gate structures, e.g., the formation of epi semiconductor material in the source/drain regions of the device. When the epi semiconductor material is formed in the source/drain regions, it is important that the epi material not form in unwanted areas of the devices so as to not create a multitude of problems, e.g., growing around the end of a gate structure so as to create a short circuit between the source region and drain region, bridging the space between two adjacent active regions, etc. Thus, with reference to FIG. 1C, when the fins are cut, the cut is located such that the cut ends of the fins will be positioned under the dummy gate structures when they are formed. This is sometimes referred to as the fins being "tucked" in the sense that the cut end of the fin is positioned under or "tucked under" the dummy gate structure. Such a tucked fin arrangement is required on integrated circuits having arrangements similar to that depicted in FIG. 1C so as to prevent the undesirable formation of epi semiconductor material in the space between the two dummy gates. Unfortunately, producing such a tucked fin arrangement requires the use of two dummy gate lines. Having two dummy gate lines at each cell boundary of an integrated circuit product consumes valuable plot space and reduces cell efficiency.

The present disclosure is directed to methods of forming diffusion breaks on IC products comprised of FinFET devices and the resulting products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming diffusion breaks on IC products comprised of FinFET devices and the resulting products. One illustrative method disclosed herein includes, among other things, forming first sacrificial gate structures above a fin for two active gates and a dummy gate positioned between the two active gates, removing the first sacrificial gate structure for the dummy gate so as to define a cavity that exposes the fin while leaving the first sacrificial gate structures for the two active gates intact, etching through the cavity to form a trench in the fin under the cavity, forming a second sacrificial gate structure in the trench and the cavity for the dummy gate, removing the first sacrificial gate structures for the two active gates and the second sacrificial gate structure for the dummy gate so as to define a replacement gate cavity for the two active gates and the dummy gate, and forming a replacement gate structure in each of the replacement gate cavities, wherein the replacement gate structure for the dummy gate extends into the trench in the fin.

Another illustrative method disclosed herein includes, among other things, forming first sacrificial gate structures above a fin for two active gates and a dummy gate positioned between the two active gates, removing the first sacrificial gate structure for the dummy gate so as to define a cavity that exposes the fin while leaving the first sacrificial gate structures for the two active gates intact, etching through the cavity to form a trench in the fin under the cavity, filling substantially all of the trench and the cavity for the dummy gate with an insulating material, removing the first sacrificial gate structures for the two active gates while leaving the insulating material in the trench and the cavity for the dummy gate intact so as to define a replacement gate cavity for each of the two active gates, and forming a replacement gate structure in each of the replacement gate cavities for the two active gates, wherein the insulating material in the trench and the cavity for the dummy gate remains intact.

One illustrative integrated circuit product disclosed herein includes, among other things, a fin defined in a semiconductor substrate, two active gate structures positioned around the fin and a diffusion break positioned laterally between the two active gate structures, the diffusion break comprising a gate structure that is positioned at least partially in a trench formed in the fin.

Another integrated circuit product disclosed herein includes, among other things, a fin defined in a semiconductor substrate, two active gate structures positioned around the fin and a diffusion break positioned laterally between the two active gate structures, the diffusion break comprising a trench formed in the fin in an area between two sidewall spacers, wherein the trench and the area between the two sidewall spacers is substantially filled with an insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
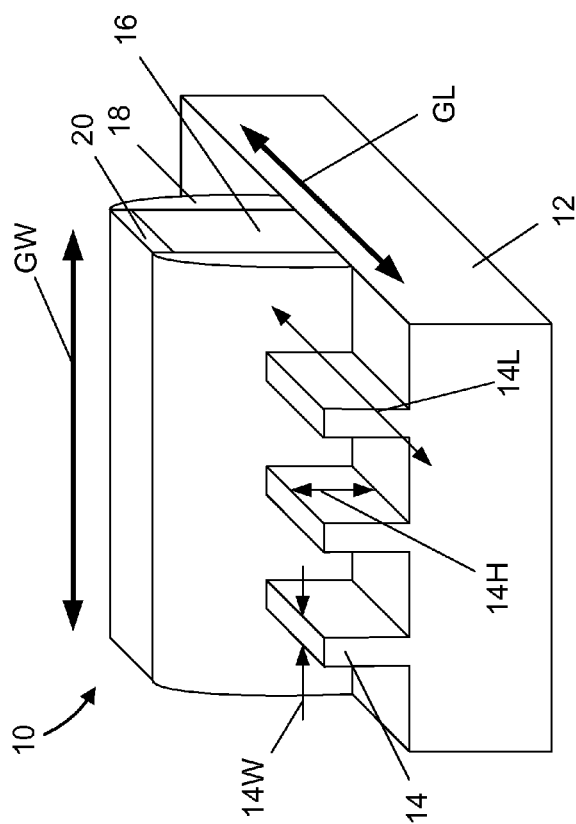
FIGS. 1A-1B depict an illustrative prior art FinFET device.
Figure 1B:
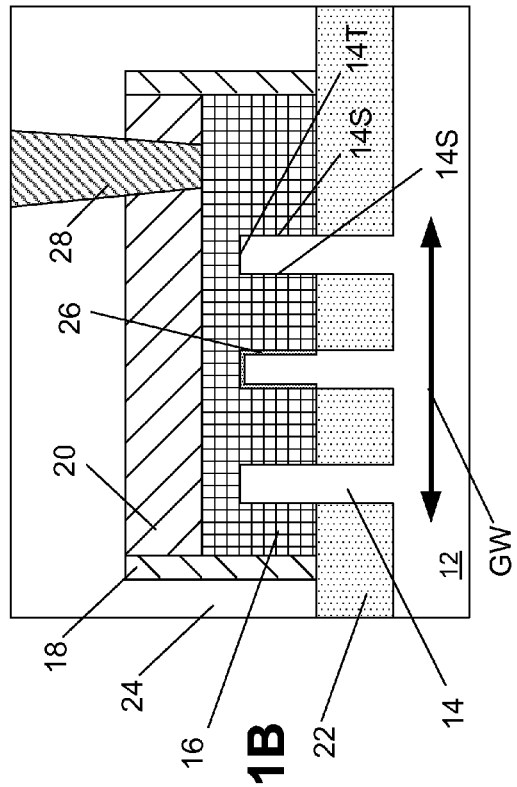
Figure 1C:
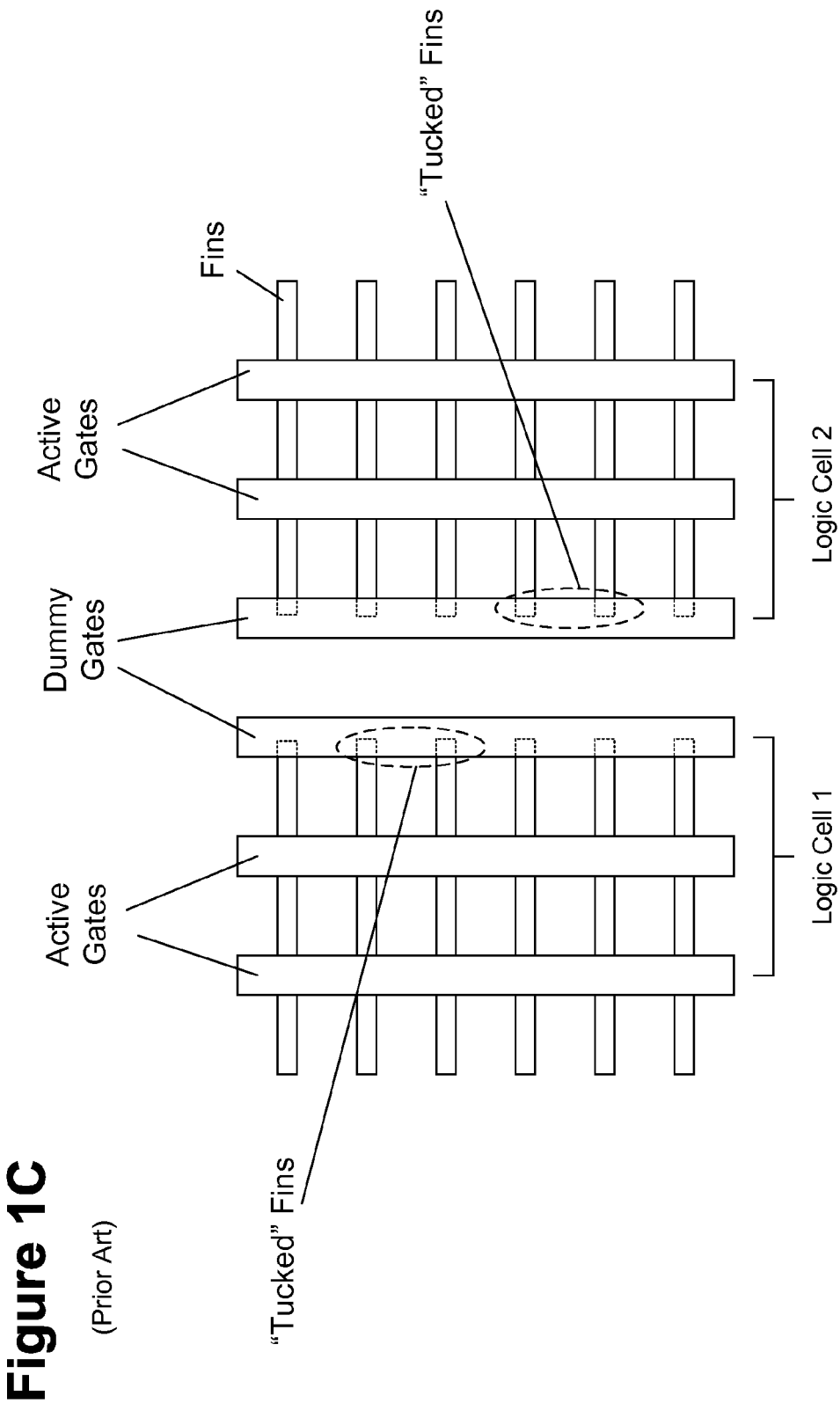
FIG. 1C is a plan view of an illustrative prior art integrated circuit product comprised of a plurality of logic cells.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
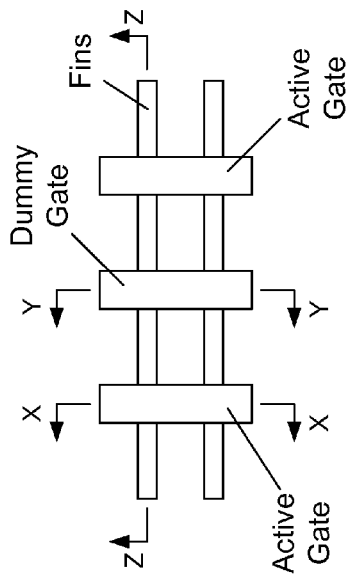
FIGS. 2A-2Q depict various illustrative novel methods disclosed herein for forming diffusion breaks on IC products comprised of FinFET devices and the resulting products.
Figure 2A:
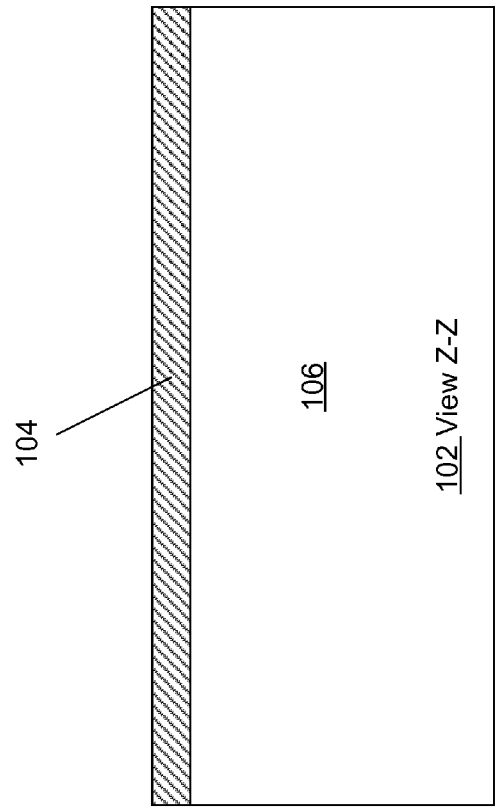
Figure 2A:
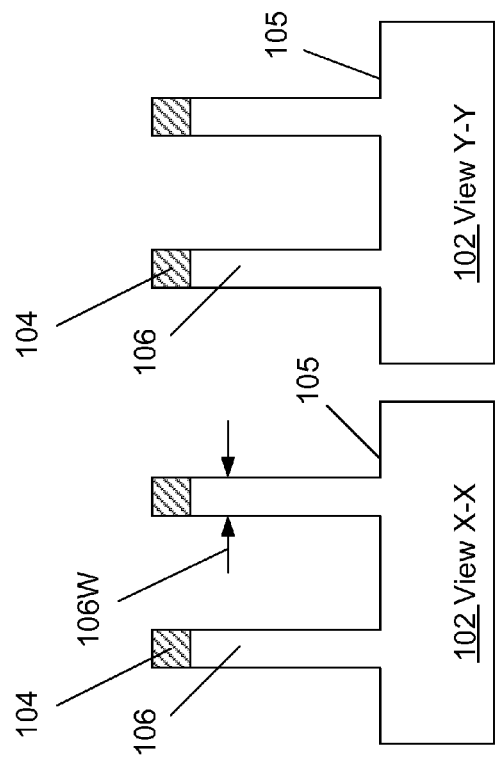
Figure 2B:
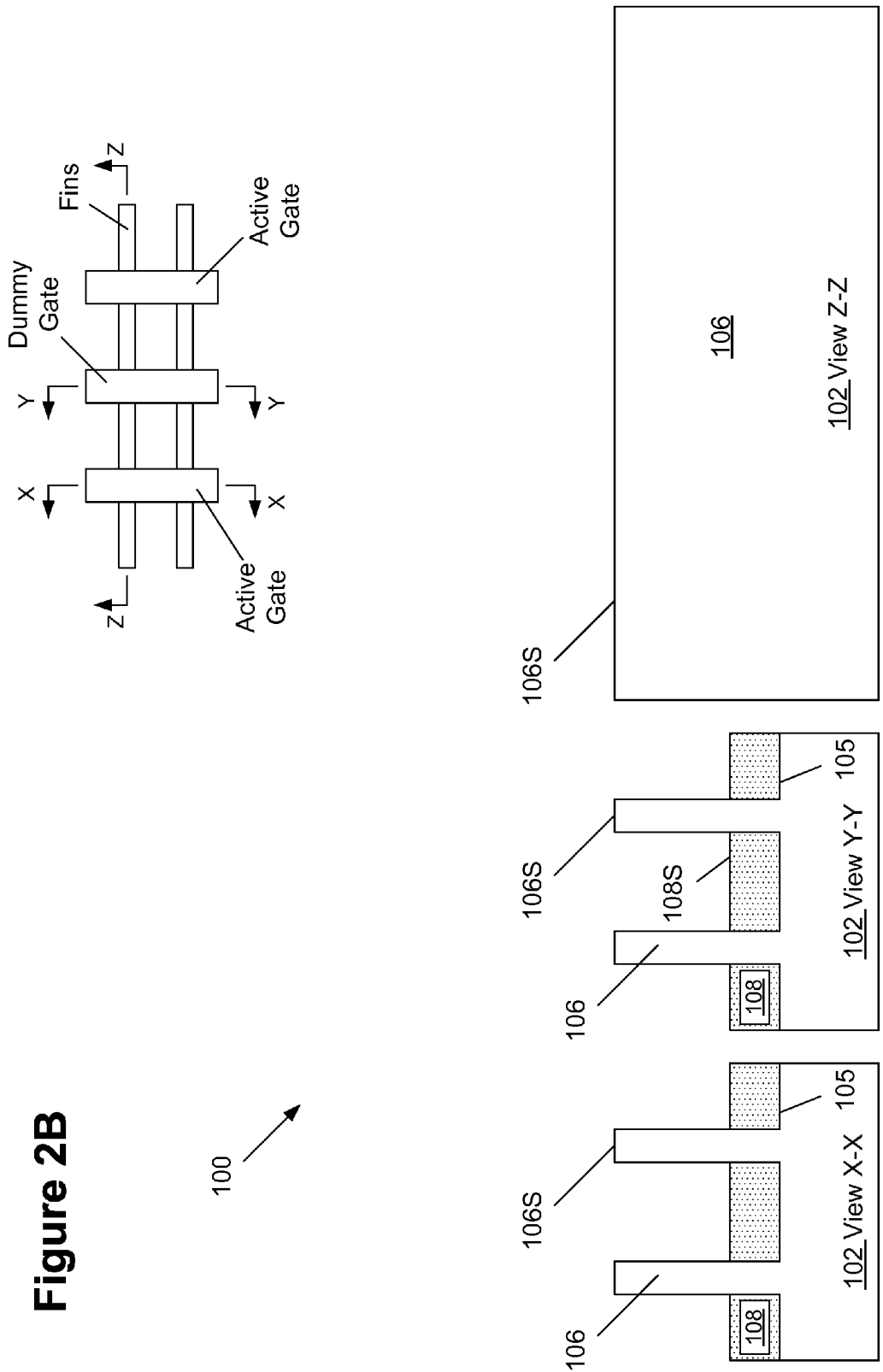
Figure 2D:
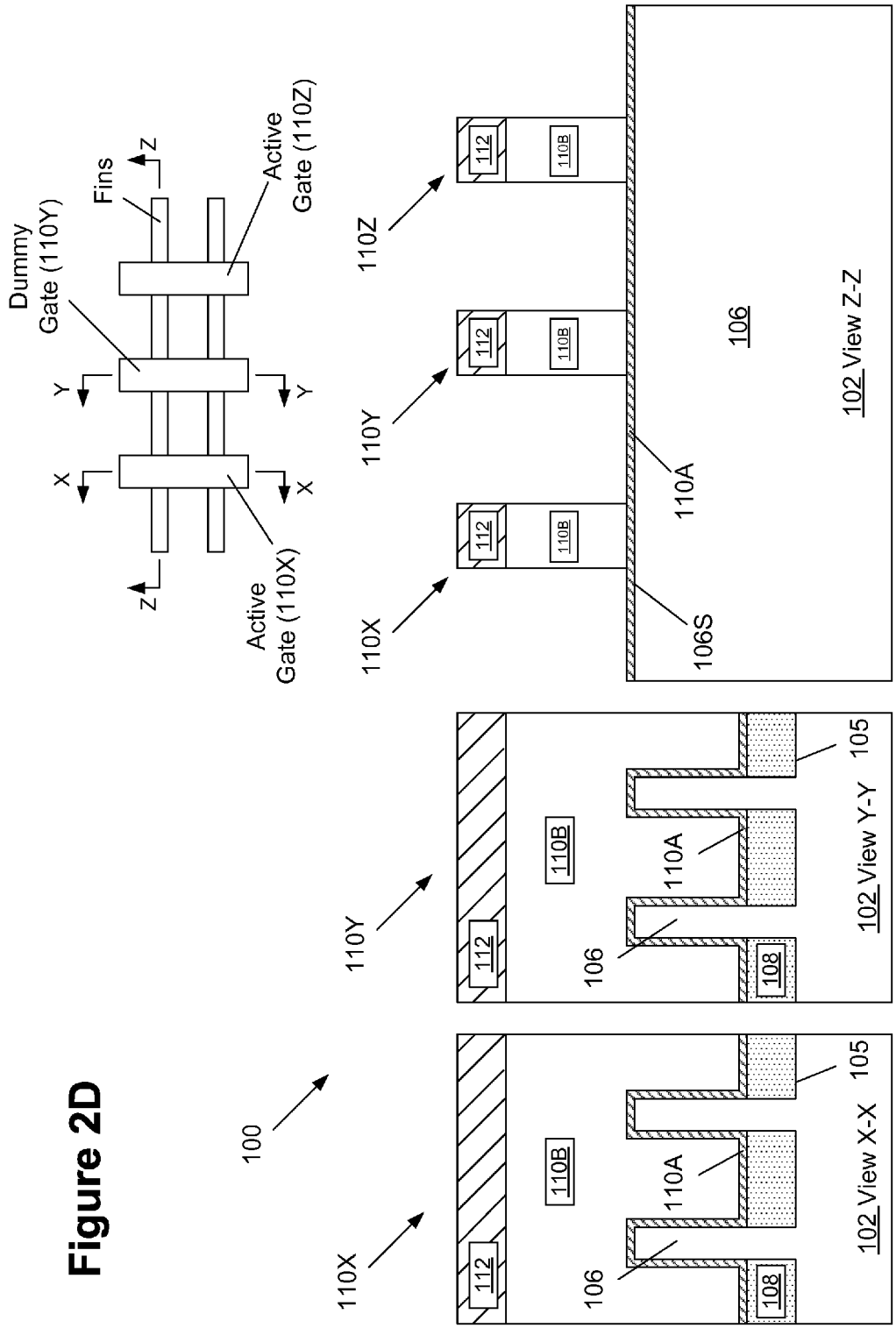
Figure 2E:
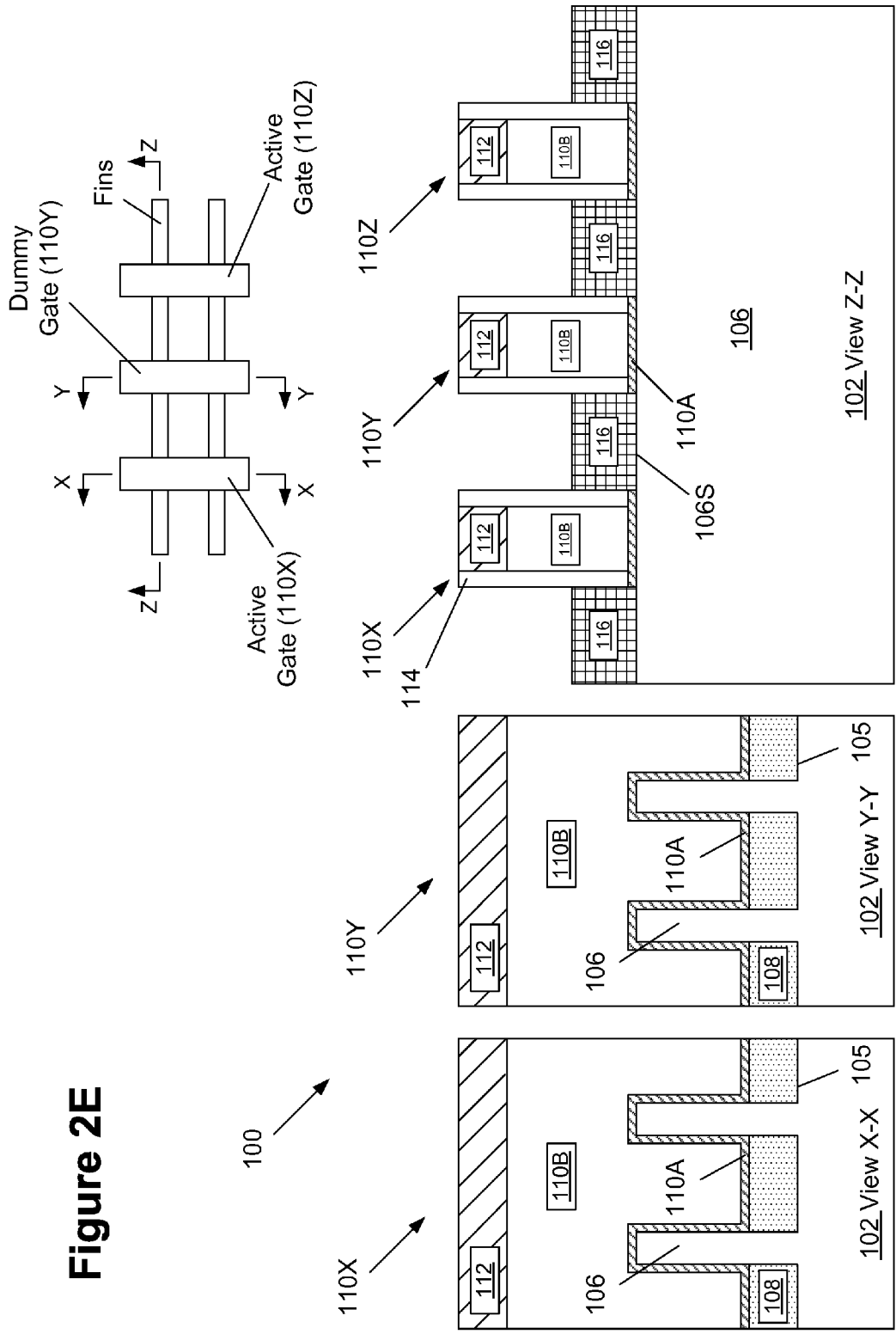
Figure 2F:
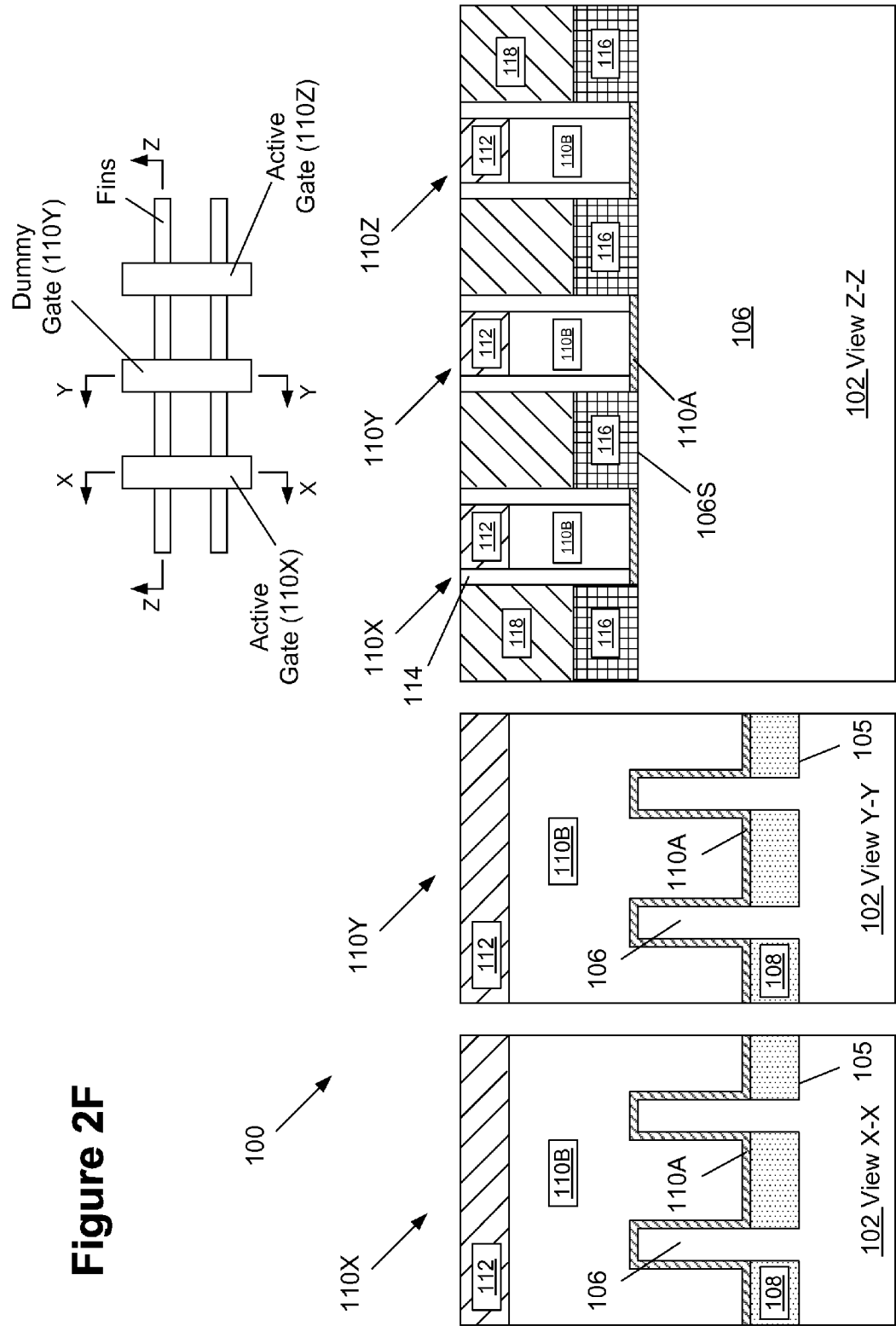
Figure 2G:
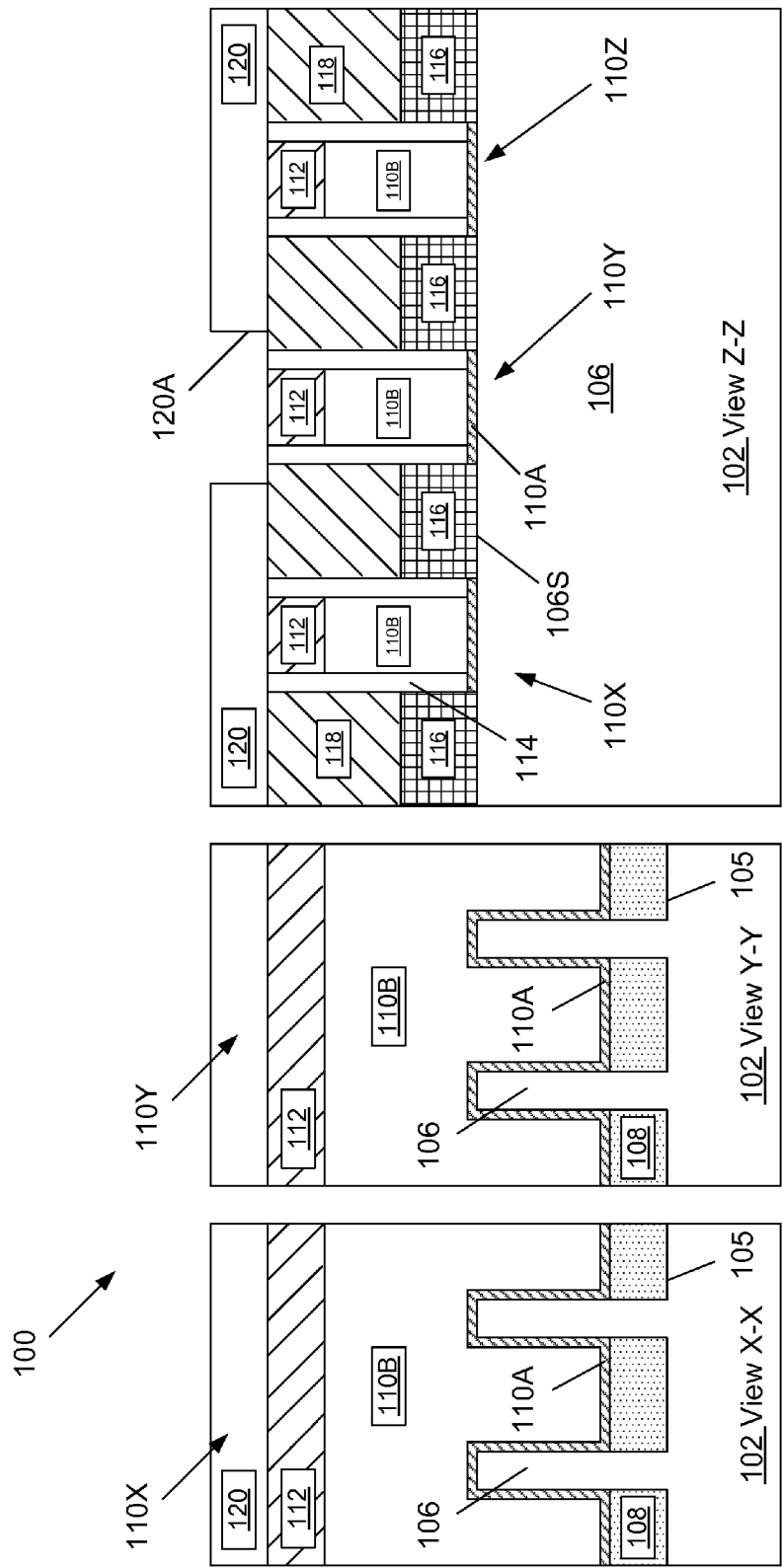
Figure 2H:
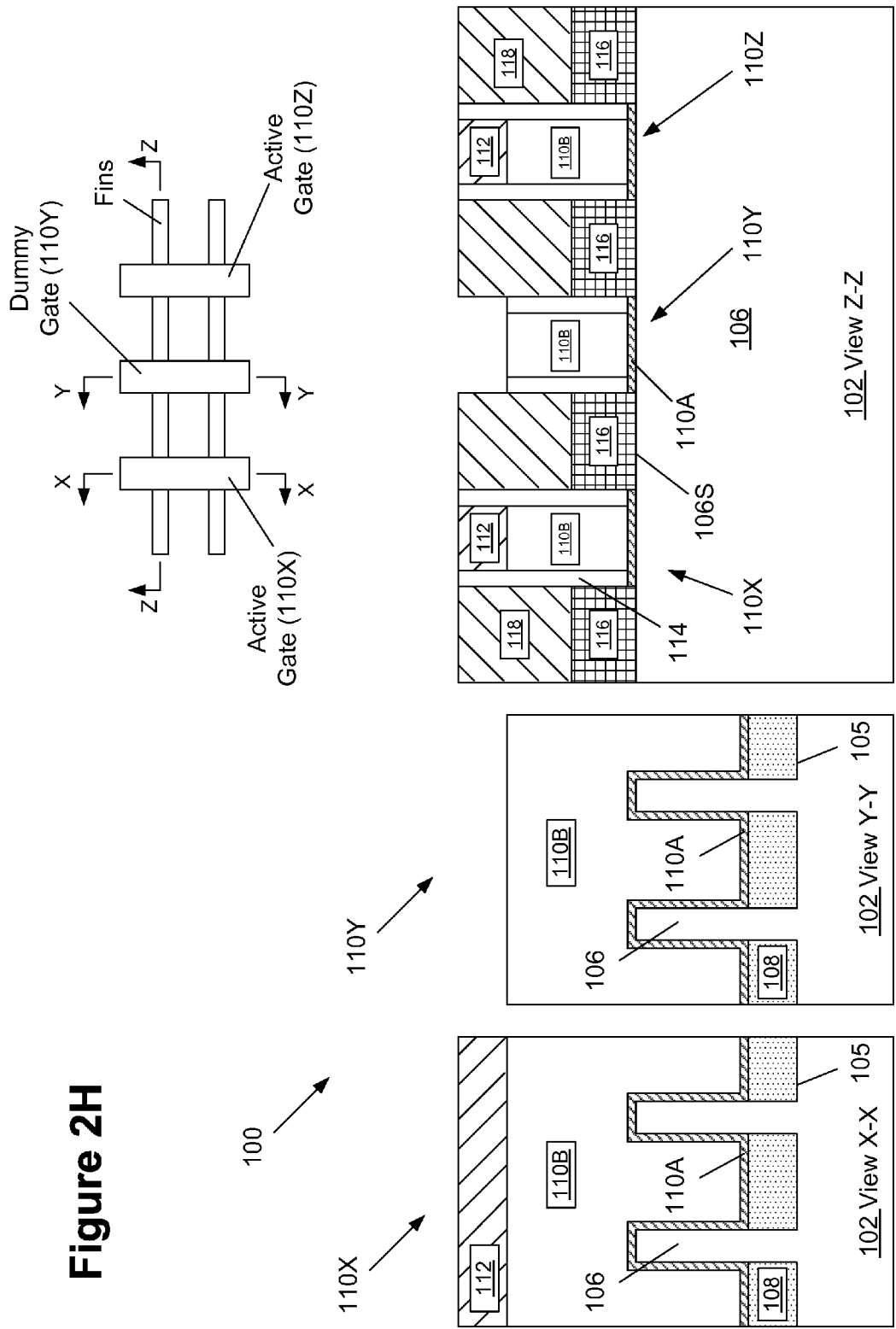
Figure 2J:
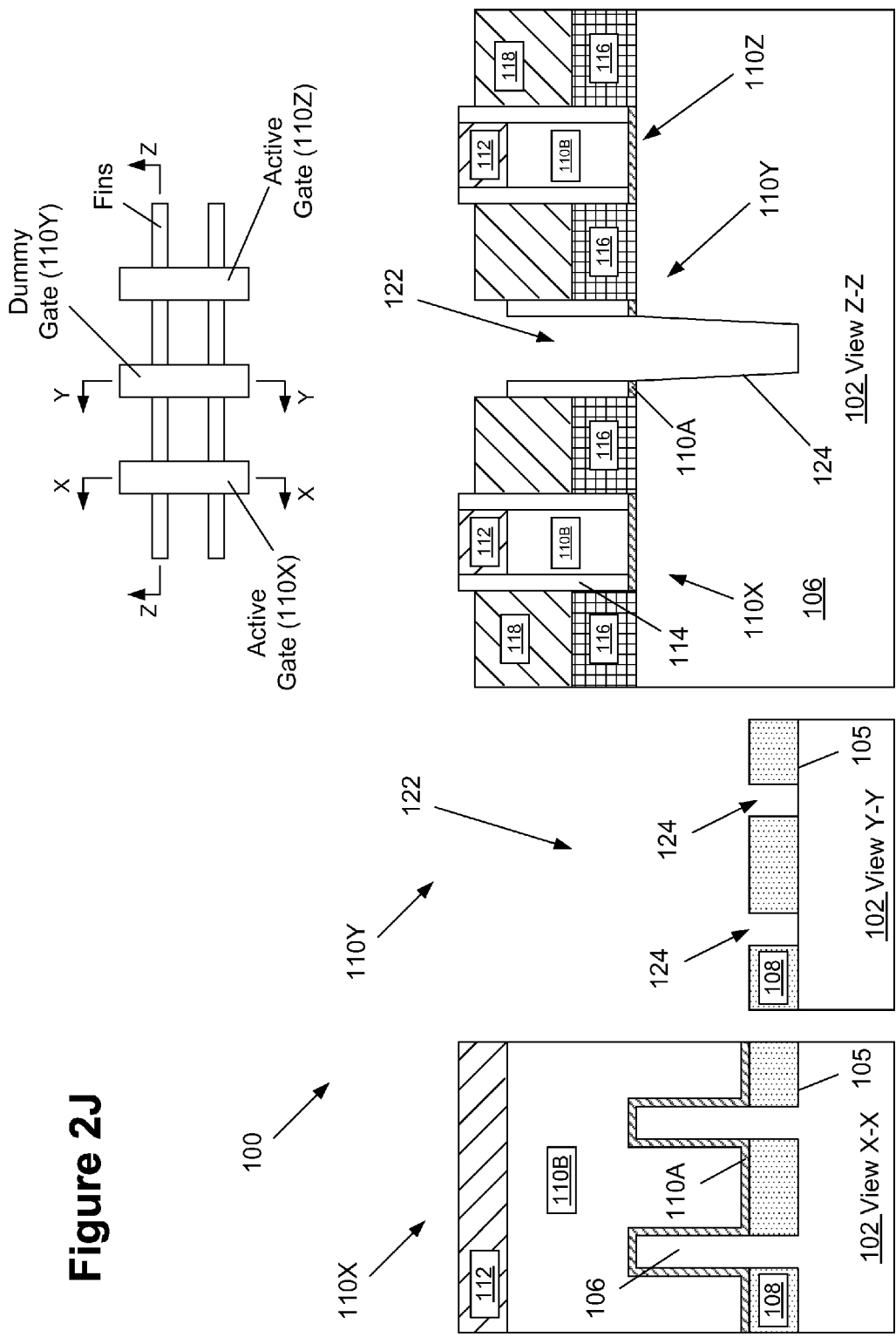
Figure 2O:
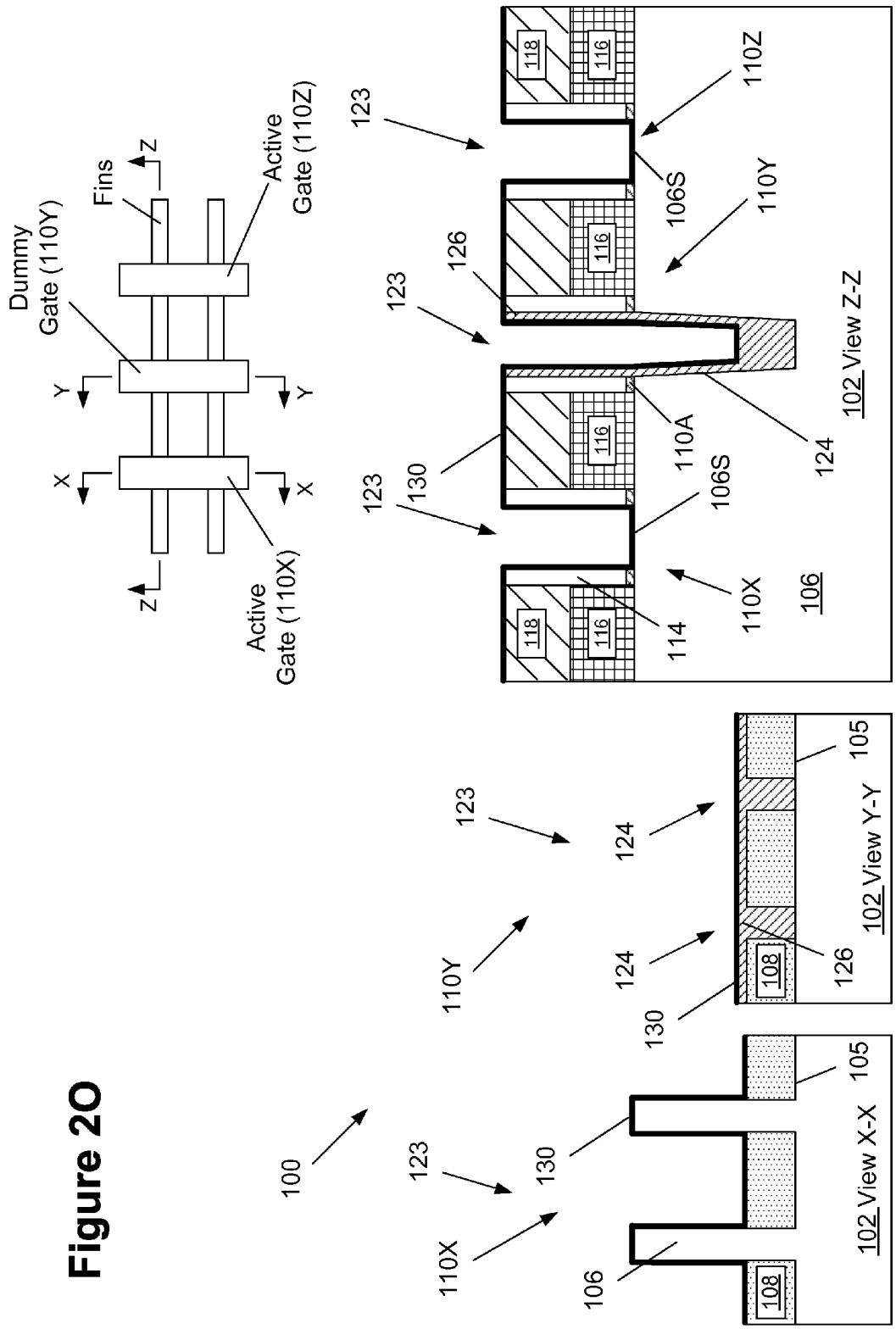
Figure 2Q:
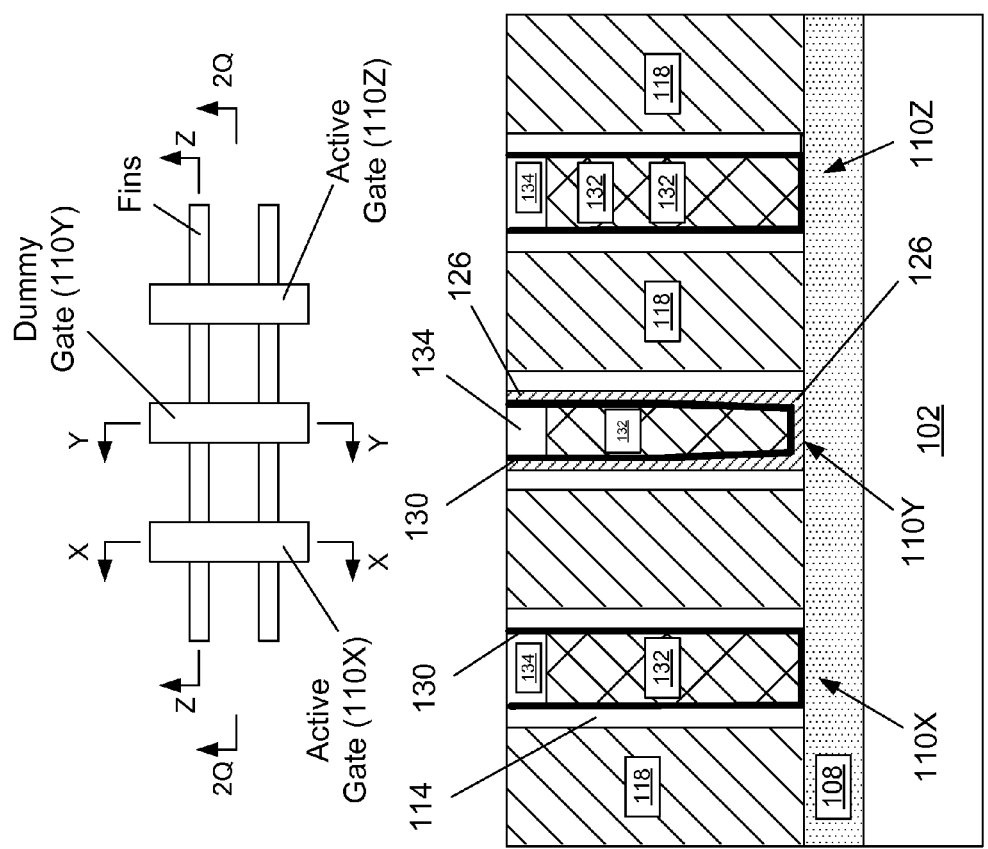

FIGS. 2A-2Q present various views of one illustrative embodiment of a method of forming a diffusion break on an integrated circuit product 100 comprised of FinFET devices and the resulting products. The drawings also include a simplistic plan view of the product 100 (in the upper right corner) that depicts the location where various cross-sectional views depicted in the following drawings will be taken. More specifically, the view "X-X" is a cross-sectional view taken through an active gate structure (in the gate-width direction) that will eventually be formed above the illustrative fins. The view Y-Y is a cross-sectional view taken through a dummy gate structure (in the gate-width direction) that will eventually be formed above the illustrative fins. The view "Z-Z" is a cross-sectional view that is taken through the long axis of a fin transverse to the long axis of the gate structures of the two active gate structures and the dummy gate structure (i.e., in a direction that corresponds to the current transport direction of the devices). Other views are taken where indicated in the attached drawings.

In the examples depicted herein, the integrated circuit product 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein several process operations have been performed. First, a patterned etch mask 104, e.g., a combination of a silicon dioxide layer (e.g., a pad oxide—not separately shown) and a silicon nitride layer (e.g., a pad nitride—not separately shown), was formed above the substrate 102. In some cases, the pad oxide layer may be omitted if desired. Thereafter, one or more etching processes were performed through the patterned etch mask 104 so as to define a plurality of trenches 105 in the substrate 102. This results in the formation of a plurality of fins 106. The illustrative FinFET product 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. The fins 106 extend laterally into and out of the drawing page in the current transport direction of the product 100 and into what will become the source/drain regions of the product 100.

With continuing reference to FIG. 2A, the overall size, shape and configuration of the trenches 105 and the fins 106 may vary depending on the particular application. The depth and width of the trenches 105 may vary depending upon the particular application. In one illustrative embodiment, based on current day technology, the overall depth (relative to the upper surface of the substrate 102) of the trenches 105 may range from approximately 20-50 nm. In the illustrative examples depicted in the attached figures, the trenches 105 and the fins 106 will be simplistically depicted as having generally rectangular portions and sections. In an actual real-world device, the sidewalls of the trenches 105 may be somewhat inwardly tapered, although that configuration is not depicted in the drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

FIG. 2B depicts the product 100 after several process operations were performed to form a recessed layer of insulating material 108, e.g., silicon dioxide, in the trenches 105 between the fins 106. The recessed layer of insulating material 108 may be formed by overfilling the trenches 105 with an insulating material, performing a CMP process on the layer of insulating material that stops on the upper surface of the fins 106 (and thereby removes the patterned hard mask layer 104), and performing a recess etching process on the layer of insulating material 108 so as to recess the upper surface 108S of the layer of insulating material 108 to a desired height level within the trenches 105.

The inventions disclosed herein will be disclosed in the context of forming a gate structure for the FinFET product 100 by performing a replacement gate process. Accordingly, FIG. 2C depicts the product 100 after material for multiple sacrificial gate structures 110, i.e., a sacrificial gate insulation layer 110A and a layer of sacrificial gate electrode material 110B, and the material for the gate cap layer 112 were sequentially deposited above the substrate 102. In general, the sacrificial gate insulation layer 110A is comprised of a material such as silicon dioxide, and the sacrificial gate electrode material 110B is comprised of a material such as polysilicon or amorphous silicon, while the gate cap layer 112 is comprised of a material such as silicon nitride. The thickness of these materials may vary depending upon the particular application.

FIG. 2D depicts the product 100 after one or more etching processes were performed through a patterned etch mask (not shown), such as a patterned layer of photoresist material, to define a plurality of sacrificial gate structures 110X, 110Y and 110Z, as well as associated gate cap layers 112, above the substrate 102. The sacrificial gate structures 110X and 110Z are for active gates, while the sacrificial gate structure 110Y is a for a dummy gate that will be laterally positioned between the two active gates. The sacrificial gate structures 110X, 110Y and 110Z are initial or original sacrificial gate structures. In general, as shown more fully below, the initial gate structure 110Y for the dummy gate will be removed, while the original gates structures 110X and 110Z remain intact. Thereafter, a second sacrificial gate structure will be formed for the dummy gate.

FIG. 2E depicts the product 100 after several process operations were performed. First, simplistically depicted sidewall spacers 114 were formed adjacent the original sacrificial gate structures 110X-Z. Thereafter, optional epi semiconductor material 116 was grown on the portions of the fins 106 positioned in the source/drain regions of the product 100, i.e., on the portions of the fins 106 positioned laterally outside of the spacers 114. In some applications, the fins 106 in the source/drain regions of the product 100 may be recessed prior to the formation of the epi semiconductor material 116.

FIG. 2F depicts the product 100 after a layer of insulating material 118, e.g., silicon dioxide, was deposited above the device 100 depicted in FIG. 2E, and after a planarization process (e.g., CMP) was performed on the layer of insulating material 118 using the gate cap layers 112 as a polish-stop.

FIG. 2G depicts the product 100 after a patterned masking layer 120, e.g., a patterned layer of photoresist, was formed above the product depicted in FIG. 2F. An opening 120A in the patterned masking layer 120 exposes the area above the gate cap layer 112 and the sidewall spacers 114 for the dummy gate structure 110Y, while masking the original gate structures 110X and 110Z for the active gates.

FIG. 2H depicts the product 100 after several process operations were performed. First, a timed recess etching process was performed through the opening 120A in the patterned masking layer 120 to remove the gate cap layer 112 and portions of the spacers 114 adjacent the original sacrificial gate structure 110Y for the dummy gate selectively relative to the surrounding structures. Thereafter, the patterned masking layer 120 was removed. These process operations expose the sacrificial gate material 110B of the original sacrificial gate structure 110Y for the dummy gate for removal.

FIG. 2I depicts the product 100 after one or more etching processes were performed to remove the sacrificial gate material 110B and the sacrificial gate insulation layer 110A of the original sacrificial gate structure 110Y for the dummy gate relative to the surrounding materials. These process operations result in the formation of a cavity 122 that exposes the surface 106S of the fins 106 within the cavity 122. As depicted, during these process operations, some of the thickness of the layer of insulating material 118 may also be consumed, as depicted by the lowered surface 118S. Note that the gate cap layers 112 still protect the original sacrificial gate structures 110X and 110Z for the active gates at this point in the process flow.

FIG. 2J depicts the product 100 after a timed, anisotropic etching process was performed through the cavity 122 to remove a portion of the fins 106 and thereby define trenches 124 in the fins 106, and perhaps in the substrate 102. As depicted in the view Y-Y, this effectively removes the fins 106 from within the cavity 122 for the dummy gate structure 110Y.

FIG. 2K depicts the product 100 after a relatively thin liner layer 126 was formed above the product 100 depicted in FIG. 2J by performing a conformal deposition process, e.g., ALD, CVD. In one illustrative embodiment, the liner layer 126 may be comprised of a material such as silicon nitride, silicon oxynitride, a low-k nitride (k value between 4 and 6.9) or silicon dioxide. The thickness of the liner layer 126 may vary depending upon the particular application, e.g., 3-8 nm. Note that, in one embodiment, the liner layer 126 may substantially fill the trenches 124 where the trench 124 has a width corresponding to the width 106W (or CD) of the fins 106 (see FIG. 2A). For example, with reference to the view Y-Y and current-day technology, the fin width 106W may normally be about 6-10 nm. Thus, a liner layer 126 having a thickness of about 5 nm or greater would tend to fill the trench 124. In contrast, with reference to view Z-Z, the top of the trench 124 has a critical dimension that corresponds approximately to the critical dimension of the gate, i.e., the lateral space in the cavity 122 between the sidewall spacers 114, which is normally greater than about 18 nm (based upon current day technology). Thus, a 5 nm thick liner layer 126 would not completely fill the trench 124 in the areas under the cavity 122 where the trench 124 is not bounded by the insulating material 108. However, as depicted, the lower-most portion of the trench 124 will be substantially filled with the liner 126 material since the lower portion of the trench 124 is bounded by the insulating material 108.

Alternatively, if the lateral width of the cavity 122 (corresponding to the gate CD) was made small enough, then even a thin liner layer 126 could fill the cavity 122 and the underlying portions of the trench 124 shown in view Z-Z of FIG. 2K. That is, the cavity 122 and underlying trench 124 may be substantially filled with an insulating material, such as silicon nitride, and no conductive gate materials would be positioned in this portion of the dummy gate 110Y when the device is completed. Such a situation is simplistically depicted in the upper left corner of FIG. 2K wherein an insulation material 126X, such as silicon nitride or other dielectric materials or a combination thereof, substantially overfills the cavity 122 and the trench 124. Eventually, the portions of the insulation material 126X positioned outside of the cavity 122 can be removed by performing one or more CMP process operations and/or recess etching processes similar to those used below to remove portions of the liner layer 126. In the case where the cavity 122 and trench 124 are substantially filled with the insulating material 126X, then the dummy gate structure 110Y could not be used as a conductive line. Only the embodiment where the liner layer 126 is formed as depicted in view Z-Z of FIG. 2K will be reflected in the remaining drawings.

In general, the next major process operation will involve forming a second sacrificial gate structure in the cavity 122 and the trenches 124 for the dummy gate structure 110Y. Accordingly, FIG. 2L depicts the product 100 after several process operations were performed. A simplistic plan view of portions of the product 100 is depicted in the upper right corner of FIG. 2L. First, another layer of sacrificial material 128 was deposited on the device 100 depicted in FIG. 2K and, particularly, so as to over-fill the cavity 122. Thereafter, one or more planarization processes were performed that ultimately stop on the sacrificial gate material 110B of the original sacrificial gate structures 110X and 110Z as well as on the layer of insulating material 118. These process operations expose the sacrificial gate materials 110B as well as the layer of sacrificial material 128. The sacrificial material layer 128 is effectively the second sacrificial gate structure for the dummy gate. These process operations also remove the liner layer 126 from everywhere except within the cavity 122 and the trenches 124 for the dummy gate 110Y. The sacrificial material layer 128 may be made of the same material as that of the sacrificial gate materials 110B, e.g., amorphous silicon.

FIG. 2M depicts the product 100 after one or more etching processes were performed to remove the sacrificial gate material 110B of the original sacrificial gate structures 110X and 110Z for the active gates, and to remove the layer of sacrificial material 128 (the second sacrificial gate structure for the dummy gate) relative to the surrounding materials. This process operation stops on the sacrificial gate insulation layer 110A for the active gate structures 110X and 110Z and on the liner layer 126 for the dummy gate structure 110Y. As depicted in the simplistic plan view of portions of the product 100 in the upper right corner of FIG. 2M, these operations expose the liner layer 126 of the dummy gate and the sacrificial gate insulation layer 110A of the active gates.

FIG. 2N depicts the product 100 after an etching process was performed to remove the sacrificial gate insulation material 110A of original sacrificial gate structures 110X and 110Z for the active gates, relative to the surrounding materials. The process operation results in the exposure of the surface 106S of the fins 106 for the active gates. At this point, replacement gate cavities 123 for the active gates and the dummy gate have been formed where a replacement gate structure will be formed. Note that the replacement gate cavity 123 for the dummy gate includes the cavity 122 as well as the trenches 124. As depicted in the simplistic plan view of portions of the product 100 in the upper right corner of FIG. 2N, after these operations, the liner layer 126 lines the replacement gate cavity 123 of the dummy gate, while removing the sacrificial gate insulation layer 110A of the active gates exposes portions of the underlying layer of insulating material 108 and the surfaces 106S of the fins 106.

At the point of processing depicted in FIG. 2N, traditional replacement gate manufacturing techniques may be performed to form replacement or final gate structures in the replacement gate cavities 123. Accordingly, FIG. 2O depicts the product 100 after a conformal deposition process was performed to form a high-k (k value of 10 or greater) gate insulation layer 130 in the replacement gate cavities 123. Typically, a pre-clean process will be performed in an attempt to remove all foreign materials from within replacement gate cavities 123 prior to forming the high-k gate insulation layer 130.

FIG. 2P depicts the product 100 after the formation of a replacement gate structure 132 and a gate cap layer 134 (e.g., silicon nitride) in each of the replacement gate cavities 123. A simplistic plan view of portions of the product 100 with the gate cap layers 134 removed is depicted in the upper right corner of FIG. 2P. The plan view also indicates the location where the cross-sectional view of a subsequent drawing (FIG. 2Q) is taken. Note that the replacement gate structure 132 for the dummy gate extends into the trenches 124 in the fins 106. By forming the replacement gate structure 132 in the dummy gate, the "dummy gate" may actually be employed for other purposes, such as a local interconnect structure.

The replacement gate structures 132 depicted herein are intended to be representative in nature of any type of replacement gate structure that may be employed in manufacturing integrated circuit products. Typically, the replacement gate structure 132 is comprised of various layers of conductive material that are sequentially deposited into the cavities 123 and above the layer of insulating material 118. Then, one or more CMP processes is performed to remove excess materials above the layer of insulating material 118. Next, a recess etching process was performed to recess the materials in the cavities 123 to make room for the gate cap layers 134. Then, the gate cap layers 134 were formed in the cavities 123 above the recessed gate materials. The gate cap layers 134 may be comprised of a variety of materials, e.g., silicon nitride, and they may be formed by overfilling the remaining portions of the cavities 123 with the gate cap material and thereafter performing a CMP process to remove excess materials that stop on the layer of insulating material 118.

As mentioned above, FIG. 2Q is a cross-sectional view that is taken between the fins 106 of the product 100. As shown therein, the high-k insulating layer 130 of the active gates is positioned on the layer of insulating material 108, while the liner layer 126 is positioned on the layer of insulating material 108 for the dummy gate. That is, for the dummy gate, the liner layer 126 is positioned between the high-k insulating material 130 and the layer of insulating material 108 in the areas between the fins 106.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a diffusion break between two active gates positioned above a fin formed in a semiconductor substrate, comprising:

forming first sacrificial gate structures above said fin for said two active gates and a dummy gate positioned between said two active gates;

performing at least one process operation to remove said first sacrificial gate structure for said dummy gate so as to define a cavity that exposes said fin while leaving said first sacrificial gate structures for said two active gates intact;

performing at least one etching process through said cavity to form a trench in said fin under said cavity;

forming a second sacrificial gate structure in said trench and said cavity for said dummy gate;

removing said first sacrificial gate structures for said two active gates and said second sacrificial gate structure for said dummy gate so as to define a replacement gate cavity for said two active gates and said dummy gate, wherein said replacement gate cavity for said dummy gate includes said trench in said fin; and forming a replacement gate structure in each of said replacement gate cavities, wherein said replacement gate structure for said dummy gate extends into said trench in said fin.

2. The method of claim 1, wherein performing said at least one process operation to remove said first sacrificial gate structure for said dummy gate comprises:
   selectively removing a gate cap layer positioned above said first sacrificial gate structure for said dummy gate while masking gate cap layers positioned above said first sacrificial gate structures for said active gates: and
   performing at least one etching process to remove said first sacrificial gate structure for said dummy gate so as to define said cavity while said gate cap layers remain positioned above said first sacrificial gate structures for said active gates.

3. The method of claim 1, wherein, prior to forming said second sacrificial gate structure for said dummy gate, the method further comprises forming a liner layer comprised of an insulating material in said trench and in said cavity, and wherein said second sacrificial gate structure is formed on said liner layer.

4. The method of claim 3, wherein said liner layer is comprised of silicon nitride, a low-k nitride or silicon dioxide.

5. The method of claim 1, wherein said first sacrificial gate structures are comprised of one of polysilicon or amorphous silicon.

6. The method of claim 1, wherein said second sacrificial gate structure for said dummy gate is comprised of one of amorphous silicon or polysilicon.

7. The method of claim 1, wherein said replacement gate structures are comprised of a high-k gate insulation layer and at least one layer of metal.

8. The method of claim 1, wherein said replacement gate structures for said active gates comprise a gate insulation layer that is formed on the surface of said fin, and said gate insulation layer for said replacement gate structure for said dummy gate is formed on a liner layer comprised of an insulating material that is positioned in said trench and said cavity.

9. The method of claim 1, wherein said first sacrificial gate structure for said dummy gate is positioned immediately adjacent said first sacrificial gate structures for each of said active gates without any other first sacrificial gate structures being positioned therebetween.

10. The method of claim 1, wherein one of said active gates is for a first cell of circuits, the other of said active gates is for a second cell of circuits that is separate from said first cell, and said dummy gate is positioned at a boundary between said first and second cells.

11. A method of forming a diffusion break between two active gates positioned above a fin formed in a semiconductor substrate, comprising:
   forming first sacrificial gate structures above said fin for said two active gates and a dummy gate positioned between said two active gates;
   forming a patterned masking layer above said substrate, said patterned masking layer covering areas above said first sacrificial gate structures for said two active gates but having an opening that exposes an area above said first sacrificial gate structure for said dummy gate;
   performing at least one first etching process through said patterned masking layer to remove a gate cap layer positioned above said first sacrificial gate structure for said dummy gate while gate cap layers positioned above said first sacrificial gate structures for said active gates remain covered by said patterned masking layer;
   removing said patterned masking layer;
   performing at least one second etching process to remove said first sacrificial gate structure for said dummy gate so as to define a cavity that exposes said fin while leaving said first sacrificial gate structures for said two active gates intact;
   performing at least one third etching process through said cavity to form a trench in said fin under said cavity;
   forming a second sacrificial gate structure in said trench and said cavity for said dummy gate;
   removing said first sacrificial gate structures for said two active gates and said second sacrificial gate structure for said dummy gate so as to define a replacement gate cavity for said two active gates and said dummy gate, wherein said replacement gate cavity for said dummy gate includes said trench in said fin; and
   forming a replacement gate structure in each of said replacement gate cavities, wherein said replacement gate structure for said dummy gate extends into said trench in said fin.

12. The method of claim 11, wherein, prior to forming said second sacrificial gate structure for said dummy gate, the method further comprises forming a liner layer comprised of an insulating material in said trench and in said cavity, and wherein said second sacrificial gate structure is formed on said liner layer.

13. The method of claim 12, wherein said liner layer is comprised of silicon nitride, a low-k nitride or silicon dioxide.

14. The method of claim 11, wherein said replacement gate structures for said active gates comprise a gate insulation layer that is formed on the surface of said fin, and said gate insulation layer for said replacement gate structure for said dummy gate is formed on a liner layer that is positioned in said trench and said cavity.

15. A method of forming a diffusion break between two active gates positioned above a fin formed in a semiconductor substrate, comprising:
   forming first sacrificial gate structures above said fin for said two active gates and a dummy gate positioned between said two active gates;
   performing at least one process operation to remove said first sacrificial gate structure for said dummy gate so as to define a cavity that exposes said fin while leaving said first sacrificial gate structures for said two active gates intact;
   performing at least one etching process through said cavity to form a trench in said fin under said cavity;
   filling substantially all of said trench and said cavity for said dummy gate with an insulating material;
   removing said first sacrificial gate structures for said two active gates while leaving said insulating material in said trench and said cavity for said dummy gate intact so as to define a replacement gate cavity for each of said two active gates; and
   forming a replacement gate structure in each of said replacement gate cavities for said two active gates, wherein said insulating material in said trench and said cavity for said dummy gate remains intact.

16. The method of claim 15, wherein performing said at least one process operation to remove said first sacrificial gate structure for said dummy gate comprises:
   selectively removing a gate cap layer positioned above said first sacrificial gate structure for said dummy gate while masking gate cap layers positioned above said first sacrificial gate structures for said active gates; and
   performing at least one etching process to remove said first sacrificial gate structure for said dummy gate so as to define said cavity while said gate cap layers remain positioned above said first sacrificial gate structures for said active gates.

17. The method of claim 15, wherein filling substantially all of said trench and said cavity for said dummy gate with an insulating material comprises performing at least one of a conformal deposition process or a blanket-deposition process.

18. The method of claim 15, wherein said insulating material is comprised of silicon nitride, a low-k nitride or silicon dioxide.

19. The method of claim 15, wherein said first sacrificial gate structures are comprised of one of polysilicon or amorphous silicon.

20. The method of claim 15, wherein said replacement gate structures are comprised of a high-k gate insulation layer and at least one layer of metal.

21. An integrated circuit product, comprising:
a fin defined in a semiconductor substrate;
two active gate structures positioned around said fin; and
a diffusion break positioned laterally between said two active gate structures, said diffusion break comprising a gate structure that is positioned at least partially in a trench formed in said fin.

22. The product of claim 21, further comprising a liner layer positioned in said trench, wherein said gate structure for said diffusion break is positioned on said liner layer.

23. The product of claim 22, wherein said liner layer is comprised of silicon nitride, a low-k nitride or silicon dioxide.

24. The product of claim 21, wherein said gate structures for said active gates and said gate structure for said diffusion break are comprised of a high-k gate insulation layer and at least one layer of metal.

25. The product of claim 21, wherein said two active gate structures and said gate structure for said diffusion break are comprised of the same materials.

26. The product of claim 21, wherein said two active gate structures comprise a gate insulation layer that is positioned on a surface of said fin, and said gate structure for said diffusion break is comprised of a gate insulation layer that is positioned on on a liner layer that is positioned in said trench.

27. The product of claim 21, wherein one of said active gates is for a first cell of circuits, the other of said active gates is for a second cell of circuits that is separate from said first cell, and said dummy gate is positioned at a boundary between said first and second cells.

28. An integrated circuit product, comprising:
a fin defined in a semiconductor substrate;
two active gate structures positioned around said fin; and
a diffusion break positioned laterally between said two active gate structures, said diffusion break comprising a trench formed in said fin in an area between two sidewall spacers, wherein said trench and said area between said two sidewall spacers is substantially filled with an insulating material.

29. The product of claim 28, wherein said insulating material is comprised of silicon nitride, a low-k nitride or silicon dioxide.

30. The product of claim 28, wherein said gate structures for said active gates are comprised of a high-k gate insulation layer and at least one layer of metal.

31. The product of claim 28, wherein one of said active gates is for a first cell of circuits, the other of said active gates is for a second cell of circuits that is separate from said first cell, and said dummy gate is positioned at a boundary between said first and second cells.

* * * * *